United States Patent
Sugi et al.

(10) Patent No.: US 11,018,289 B2
(45) Date of Patent: May 25, 2021

(54) THERMOELECTRIC GENERATION SYSTEM

(71) Applicant: Kabushiki Kaisha Toshiba, Minato-ku (JP)

(72) Inventors: Keiji Sugi, Fujisawa (JP); Atsushi Wada, Kawasaki (JP); Tomoya Takeda, Yokohama (JP); Jun Takasaki, Yokohama (JP); Kenichi Shimano, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/900,107

(22) Filed: Feb. 20, 2018

(65) Prior Publication Data
US 2019/0088845 A1 Mar. 21, 2019

(30) Foreign Application Priority Data
Sep. 19, 2017 (JP) .............................. JP2017-178849

(51) Int. Cl.
*H01L 35/30* (2006.01)
*H01L 35/32* (2006.01)
(Continued)

(52) U.S. Cl.
CPC ............ *H01L 35/30* (2013.01); *F01K 13/006* (2013.01); *H01L 35/32* (2013.01); *H02K 7/1823* (2013.01);
(Continued)

(58) Field of Classification Search
CPC ......... H01L 35/30; H01L 35/32; H01L 35/34; H01L 35/325; F01K 7/12; F01K 7/16;
(Continued)

(56) References Cited

U.S. PATENT DOCUMENTS

| 6,269,645 | B1 * | 8/2001 | Yamaguchi ............. F01K 23/06 60/653 |
| 2010/0243016 | A1 * | 9/2010 | Awashima ............. F01K 25/10 136/205 |

(Continued)

FOREIGN PATENT DOCUMENTS

| CN | 104564191 A | 4/2015 |
| JP | 2009-081970 | 4/2009 |

(Continued)

OTHER PUBLICATIONS

English machine translation of Murahara (JP 2013-087302 A) provided by the EPO. (Year: 2019).*

*Primary Examiner* — Daniel P Malley, Jr.
(74) *Attorney, Agent, or Firm* — Oblon, McClelland, Maier & Neustadt, L.L.P.

(57) ABSTRACT

Disclosed is a thermoelectric generation system that generates electricity using waste heat from a steam condenser that exchanges heat with steam as cyclic water flows through a high temperature portion and a low temperature portion, the thermoelectric generation system including: a first hot-water discharge line used to discharge the cyclic water passing through the high temperature portion; a cyclic water circulation line through which the cyclic water from under water circulates; and a thermoelectric generation unit that generates electricity on the basis of a temperature difference between a temperature of the cyclic water flowing through the first hot-water discharge line and a temperature of the cyclic water flowing through the cyclic water circulation line.

9 Claims, 14 Drawing Sheets

(51) Int. Cl.
*H02K 7/18* (2006.01)
*F01K 13/00* (2006.01)
*H02K 19/16* (2006.01)
*F01D 15/10* (2006.01)

(52) U.S. Cl.
CPC ............ *H02K 19/16* (2013.01); *F01D 15/10* (2013.01); *F05D 2220/31* (2013.01); *F05D 2220/76* (2013.01)

(58) Field of Classification Search
CPC . F01K 7/18; F01K 7/226; F01K 13/00; F01K 13/003; F01K 13/02; F01K 17/00
See application file for complete search history.

(56) References Cited

U.S. PATENT DOCUMENTS

| | | | | |
|---|---|---|---|---|
| 2014/0230871 A1* | 8/2014 | Nishio | ................ | C08G 61/126 136/205 |
| 2016/0087184 A1* | 3/2016 | Dzuba | ................... | G21D 1/006 376/384 |
| 2018/0033941 A1* | 2/2018 | Matsuda | ................ | B01J 19/24 |

FOREIGN PATENT DOCUMENTS

| | | | |
|---|---|---|---|
| JP | 2013-087302 | | 5/2013 |
| JP | 2013087302 A | * | 5/2013 |
| JP | 5970664 | | 8/2016 |

\* cited by examiner

FIG.9
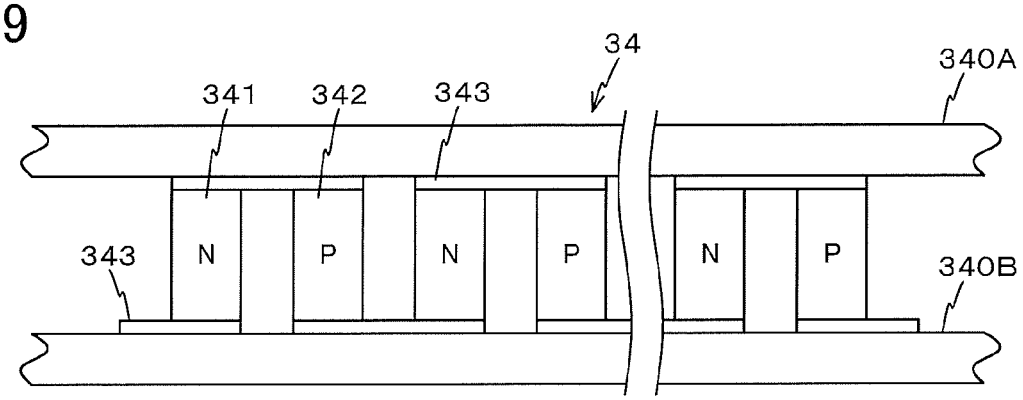
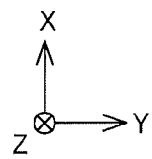
FIG.10
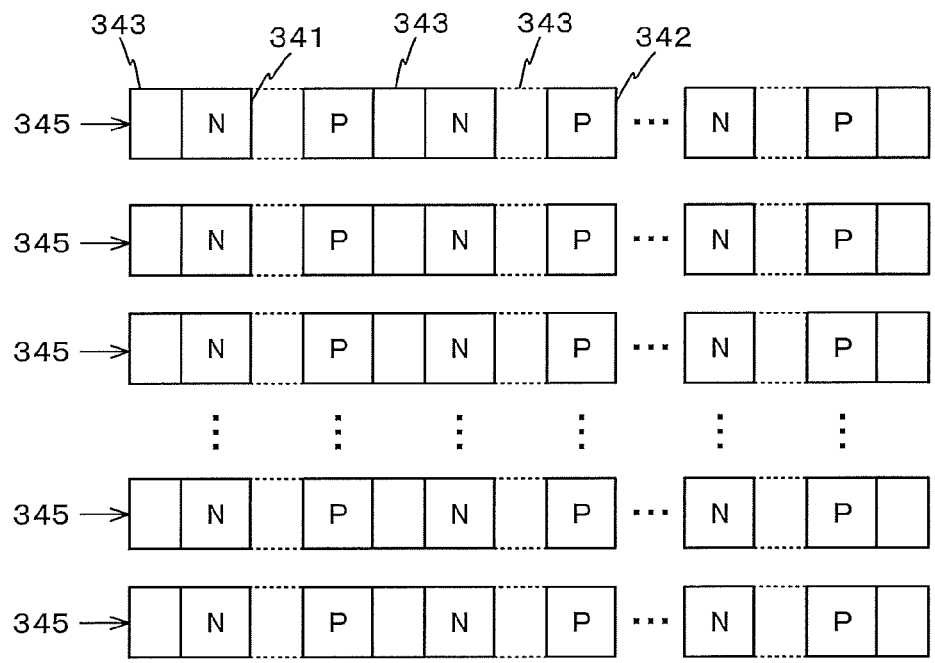
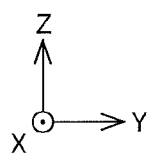

THERMOELECTRIC GENERATION SYSTEM

CROSS-REFERENCE TO RELATED APPLICATIONS

This application is based upon and claims the benefit of priority from the prior Japanese Patent Application No. 2017-178849 filed in Japan on Sep. 19, 2017; the entire contents of which are incorporated herein by reference.

FIELD

Embodiments described herein relate generally to a thermoelectric generation system.

BACKGROUND

In a nuclear power plant, a thermal power plant, and the like, steam for driving a turbine is cooled by seawater circulating through a steam condenser. The seawater which receives thermal energy by cooling the steam is drained to the sea. As a result, the thermal energy is also discharged to the sea along with the seawater. In this regard, various techniques for reusing the thermal energy discharged to the sea have been proposed.

For example, a thermoelectric generation system has been discussed, in which a pipe for draining the seawater from the steam condenser is laid under the sea, and electricity is generated using a difference between a temperature of the seawater flowing through the pipe and a temperature of the seawater of the sea.

The seawater circulating through the steam condenser is drained from a high temperature portion of the steam condenser through a low temperature portion to the sea. In the thermoelectric generation system of the prior art, electricity is generated using the thermal energy of the seawater passing through the low temperature portion. For this reason, it is difficult to efficiently generate electricity when the difference between the temperature of the seawater drained from the steam condenser and the temperature of the seawater of the sea is relatively small. Therefore, the thermoelectric generation system of the prior art has unsatisfactory electric generation efficiency, and the generated electric energy is also small relative to the thermal energy of the waste water.

When the seawater is drained from the steam condenser to the sea, it is necessary to maintain a difference between the temperature of the waste water and the temperature of the seawater of the sea within a range of 7° C. from the viewpoint of reduction of an environmental burden. In the thermoelectric generation system of the prior art, a pipe from the steam condenser is laid under the sea. Therefore, it is difficult to generate electricity using the waste water having a high temperature.

In the thermoelectric generation system of the prior art, since the pipe from the steam condenser or the thermoelectric conversion element is laid under the sea, an equipment installation cost increases. In addition, since maintenance is difficult, an equipment running cost also increases.

BRIEF DESCRIPTION OF THE DRAWINGS

FIG. 9 is a side view illustrating a schematic configuration of a thermoelectric conversion element;

FIG. 10 is a plan view illustrating a schematic configuration of the thermoelectric conversion element;

DETAILED DESCRIPTION

A thermoelectric generation system according to this embodiment generates electricity using waste heat from a steam condenser that performs heat exchange with steam as cyclic water flows through a high temperature portion and a low temperature portion. The thermoelectric generation system includes a first hot-water discharge line used to discharge the cyclic water passing through the high temperature portion, a cyclic water circulation line through which the cyclic water from under water circulates, and a thermoelectric generation unit which generates electricity using a temperature difference between a temperature of the cyclic water flowing through the first hot-water discharge line and a temperature of the cyclic water flowing through the cyclic water circulation line.

An embodiment of the invention will now be described with reference to the accompanying drawings. In the following description, the Cartesian coordinates system including X, Y, and Z axes perpendicular to each other is employed as appropriate.

Figure 1:
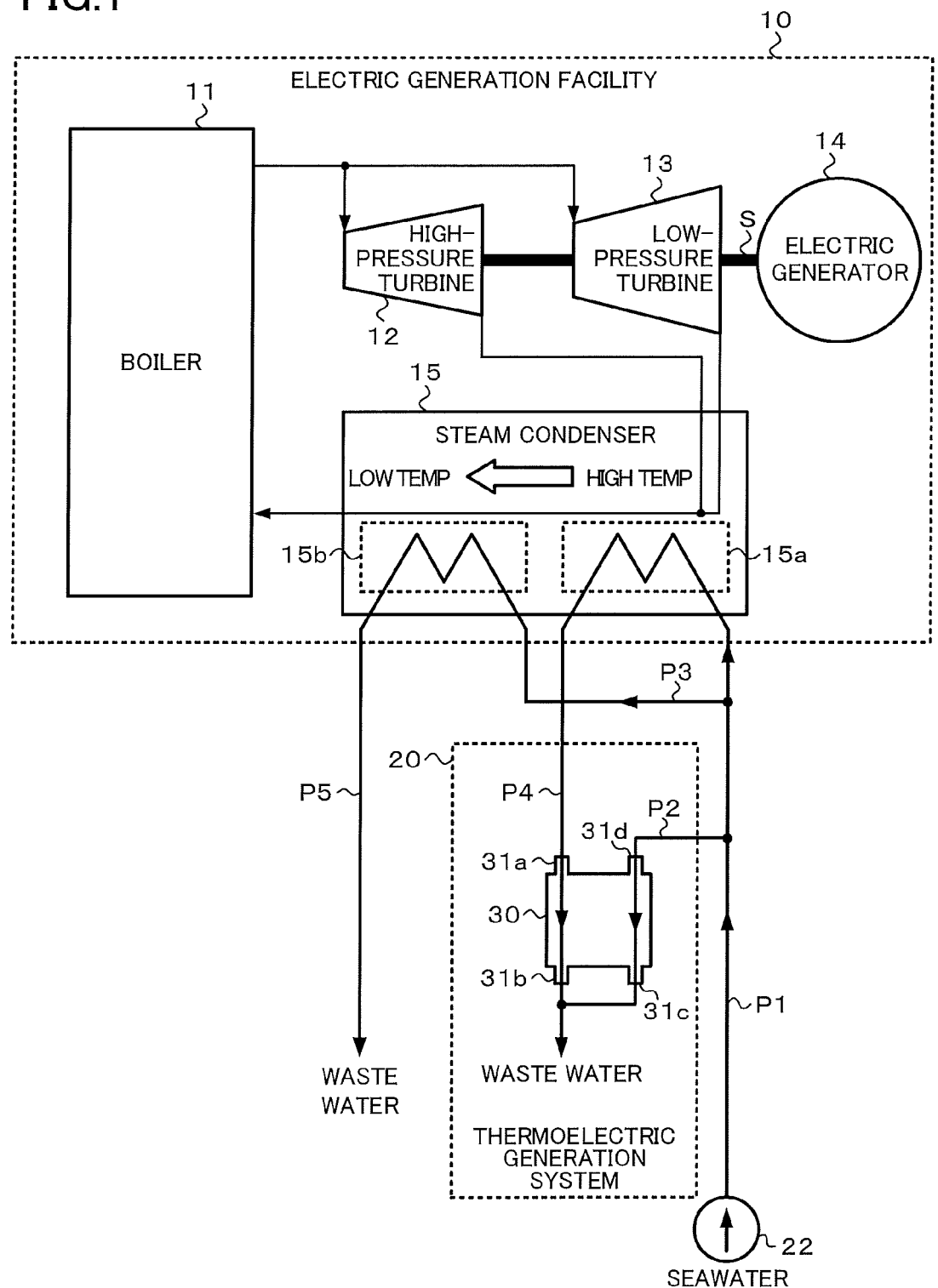
FIG. 1 is a diagram illustrating a schematic configuration of a thermoelectric generation system according to an embodiment of the invention.

FIG. 1 is a diagram illustrating schematic configurations of a thermoelectric generation system 20 according to this embodiment and an electric generation facility 10 arranged side by side along with the thermoelectric generation system 20. The thermoelectric generation system 20 is a system for generating electricity using waste heat discharged from the electric generation facility 10. The electric generation facility 10 is, for example, a commercially available electric generation facility provided with a boiler 11 for generating steam using nuclear power or thermal power, an electric generator 14, a high-pressure turbine 12 and a low-pressure turbine 13 for rotating a rotation shaft S of the electric generator 14, and a steam condenser 15 which condenses the steam. The high-pressure turbine 12 and the low-pressure turbine 13 are provided in the rotation shaft of the electric generator 14. The electric generator 14 is, for example, a synchronous electric generator.

In the electric generation facility 10, the steam generated by the boiler 11 is supplied to the high-pressure turbine 12 and the low-pressure turbine 13. As a result, the high-pressure turbine 12 and the low-pressure turbine 13 are rotated, and the rotation shaft S of the electric generator 14 is rotated. The electric generator 14 can transmit power as the rotation shaft S is rotated at a rated rotation number.

The steam used to drive the high-pressure turbine 12 and the low-pressure turbine 13 is discharged from the high-pressure turbine 12 and the low-pressure turbine 13 and is then evacuated to the steam condenser 15. The steam condenser 15 is an apparatus which performs condensation by cooling the steam by performing the heat exchange between the steam and the seawater. The steam condenser 15 according to this embodiment has, for example, a high-temperature cooling unit 15a which cools high-temperature steam and a low-temperature cooling unit 15b which cools low-temperature steam. The high-temperature cooling unit 15a is connected to a seawater pump 22 through a pipeline P1, and the low-temperature cooling unit 15b is connected to the seawater pump 22 through the pipeline P1 and a pipeline P3 branching from the pipeline P1.

As the seawater pump 22 is operated, cyclic water such as the seawater is supplied to the high-temperature cooling unit 15a through the pipeline P1, and the seawater is supplied to the low-temperature cooling unit 15b through the pipelines P1 and P3. The seawater supplied to the high-temperature cooling unit 15a performs heat exchange with the steam discharged from the high-pressure turbine 12 and the low-pressure turbine 13 and is discharged to the sea through a pipeline P4. Similarly, the seawater supplied to the low-temperature cooling unit 15b performs heat exchange with the steam discharged from the high-pressure turbine 12 and the low-pressure turbine 13 and is discharged to the sea through a pipeline P5. In this manner, the seawater circulates between the high-temperature cooling unit 15a and the low-temperature cooling unit 15b using the seawater pump 22. In addition, the steam supplied to the steam condenser 15 sequentially passes through the high-temperature cooling unit 15a and the low-temperature cooling unit 15b, so that it is cooled and condensed.

Figure 2:
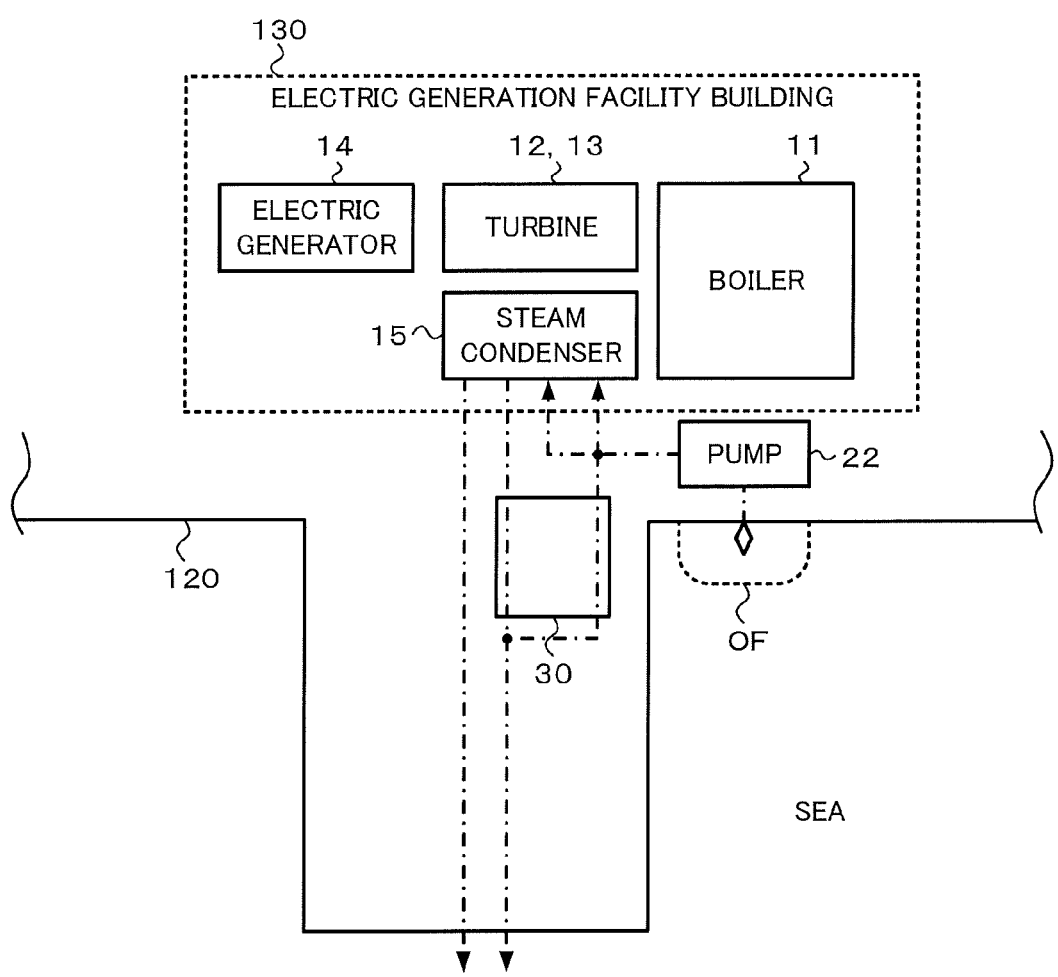
FIG. 2 is a diagram schematically illustrating an equipment layout of an electric generation facility.

FIG. 2 is a diagram schematically illustrating an equipment layout of the electric generation facility 10. As illustrated in FIG. 2, the boiler 11, the high-pressure turbine 12, the low-pressure turbine 13, and the electric generator 14 are provided inside of an electric generation facility building 130 placed the vicinity of a sea embankment 120. In addition, the seawater pump 22 is provided in the sea embankment 120 to take the seawater through an oil fence OF and supplies the taken seawater to the steam condenser 15 or the like.

The thermoelectric generation system 20 is a system which generates electricity using a difference between a temperature of the seawater under the sea and a temperature of the seawater discharged from the high-temperature cooling unit 15a. The thermoelectric generation system 20 has a generator unit 30.

Figure 3:
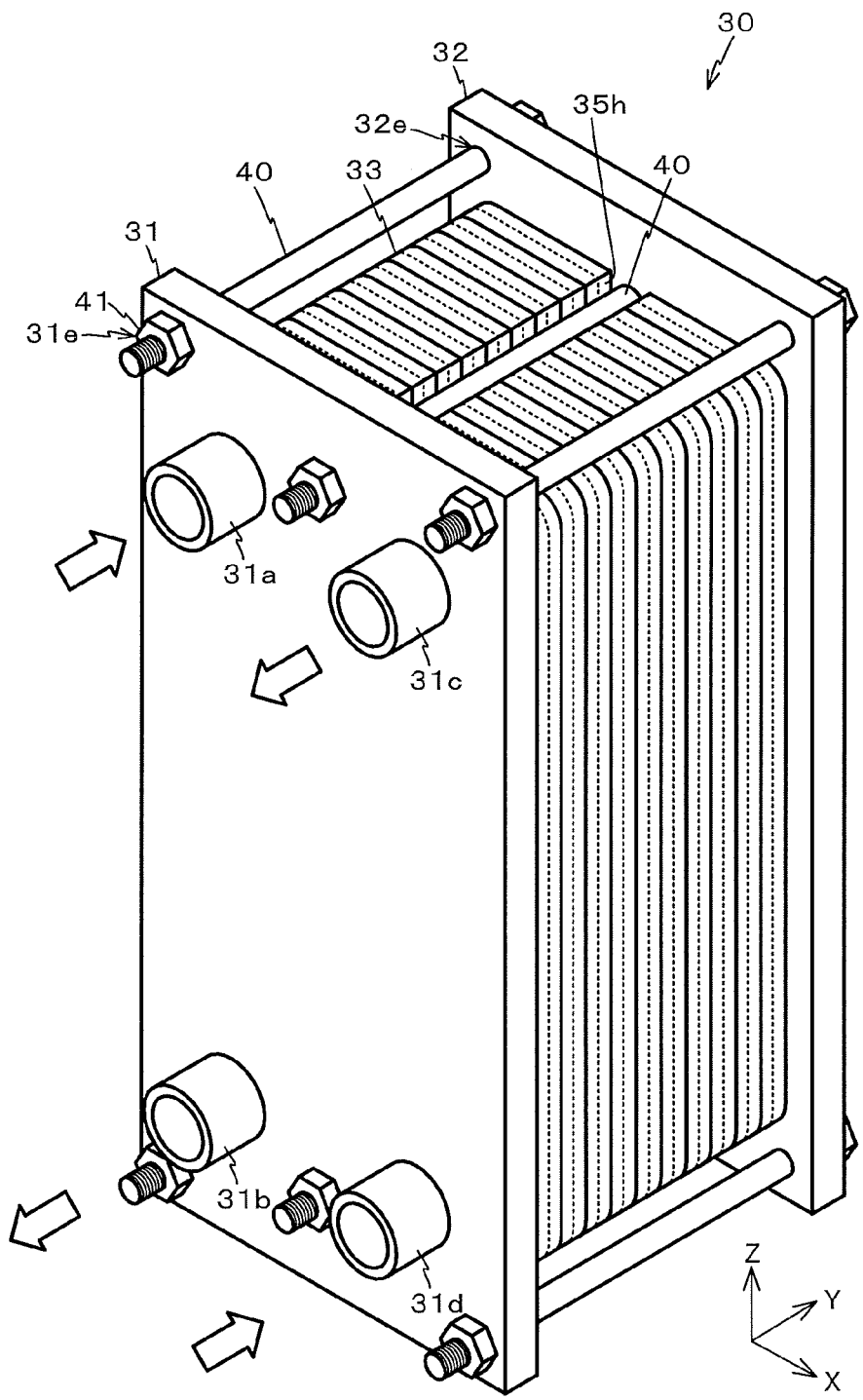
FIG. 3 is a perspective view illustrating a generator unit.

FIG. 3 is a perspective view illustrating the generator unit 30. The generator unit 30 is a unit for generating electricity by conducting hot water and cold water. The generator unit 30 has a plurality of generator modules 33, and a pair of support plates 31 and 32 that support the generator module 33.

For example, the seawater as the cold water has a temperature of 10 to 30° C., and the seawater as the hot water has a temperature of 17 to 37° C. A temperature difference between the cold water and the hot water is set to approximately 7° C.

Figure 4:
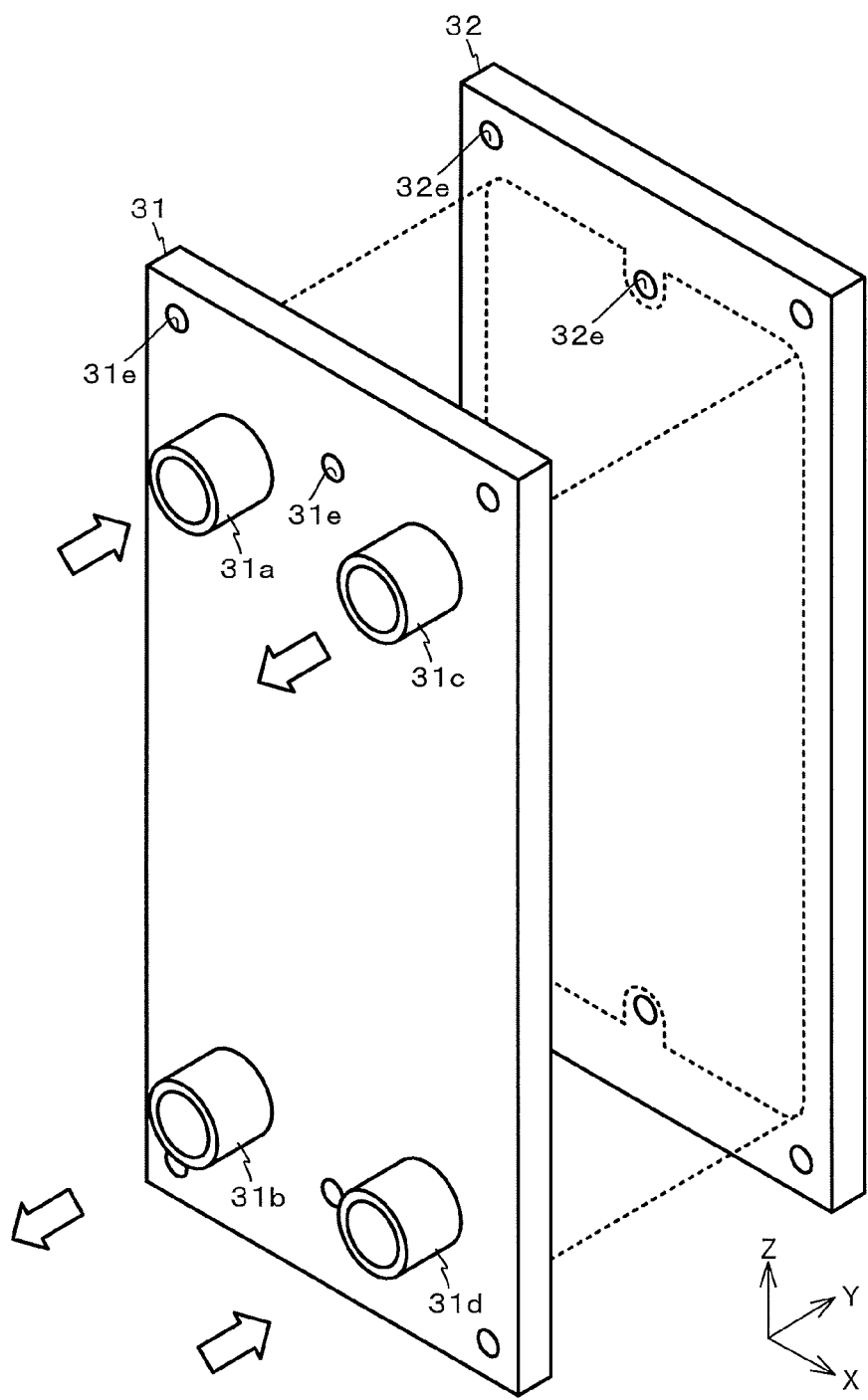
FIG. 4 is a perspective view illustrating support plates.

FIG. 4 is a perspective view illustrating support plates 31 and 32. As illustrated in FIG. 4, the support plates 31 and 32 are rectangular plate-shaped members having longitudinal directions set in the Z-axis direction. The support plates 31 and 32 are formed of a material having high corrosion resistance against seawater, such as titanium, stainless steel, or resin. The support plates 31 and 32 have four corners and circular openings 31e and 32e provided in an upper center and a lower center to penetrate in the Y-axis direction.

A water intake port 31a for feeding hot water and a water drainage port 31b for draining hot water are provided in the upper and lower corners, respectively, of the −X-side of the support plate 31. In addition, a water drainage port 31c for draining cold water and a water intake port 31d for feeding cold water are provided in an upper corner and a lower corner, respectively, of the +X-side of the support plate 31. The water intake ports 31a and 31d and the water drainage ports 31b and 31c penetrate through the support plate 31 in the Y-axis direction.

Figure 5:
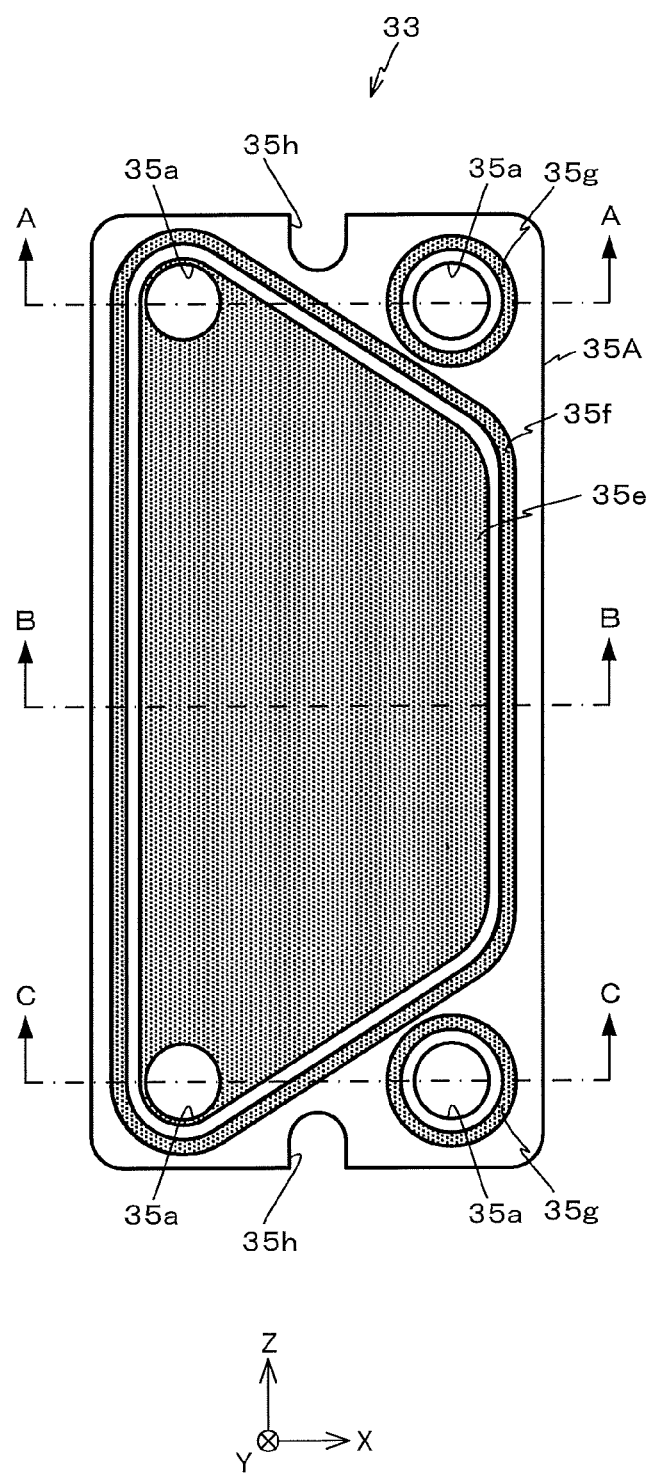
FIG. 5 is a plan view illustrating a generator module.

FIG. 5 is a plan view illustrating the generator module 33. The generator module 33 is a member having a longitudinal direction set in the Z-axis direction. The generator module 33 is provided with openings 35a corresponding to the water intake ports 31a and 31d and the water drainage ports 31b and 31c of the support plate 31 in four corners.

Figure 6:
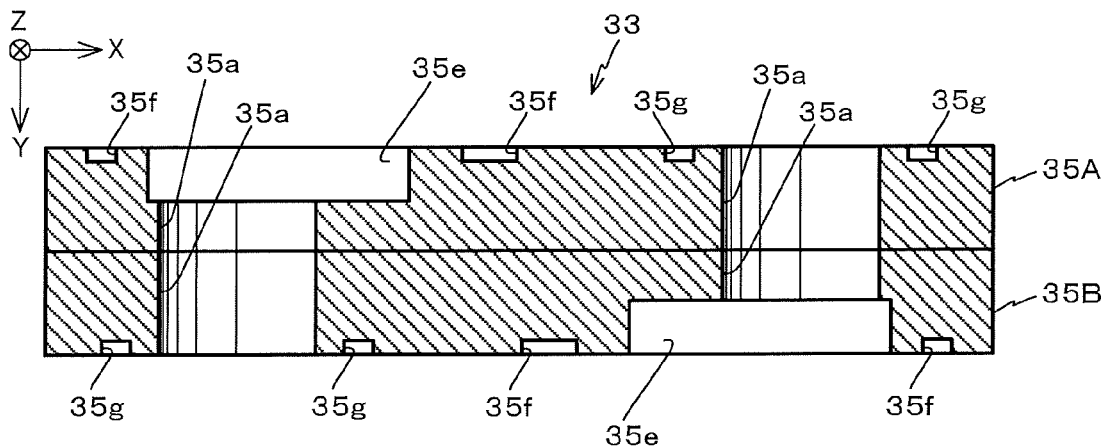
FIG. 6 is a cross-sectional view taken along a line AA of the generator module.
Figure 7:
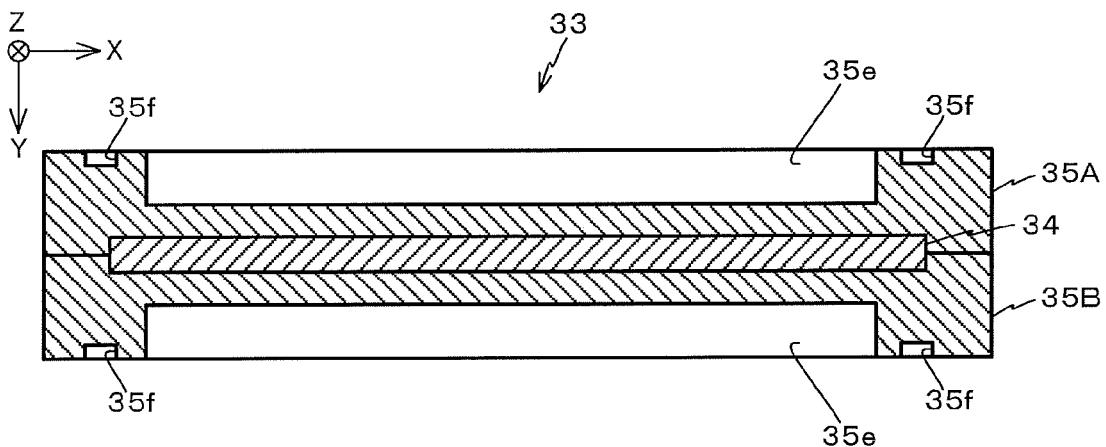
FIG. 7 is a cross-sectional view taken along a line BB of the generator module.
Figure 8:
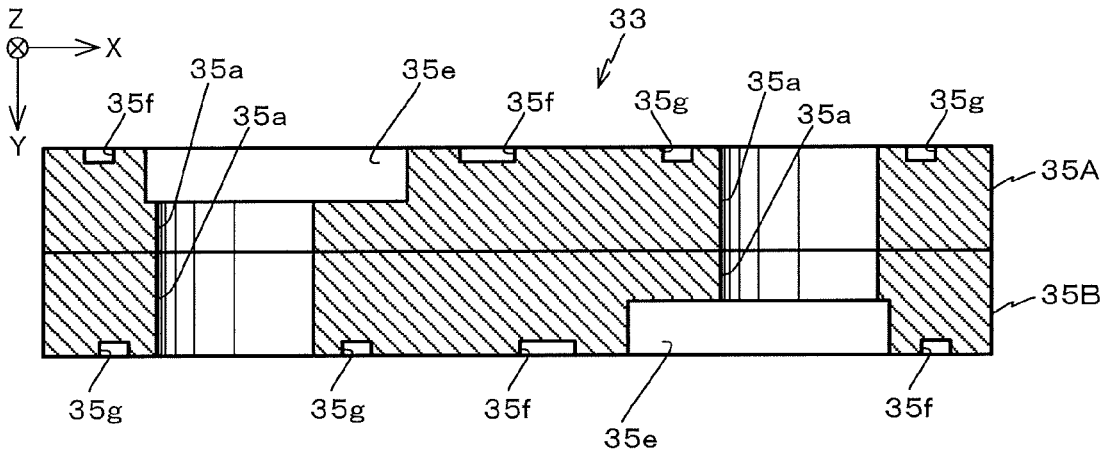
FIG. 8 is a cross-sectional view taken along a line CC of the generator module.

FIG. 6 is a cross-sectional view taken along a line AA of the generator module 33 of FIG. 5. FIG. 7 is a cross-sectional view taken along a line BB of the generator module 33 of FIG. 5. FIG. 8 is a cross-sectional view taken along a line CC of the generator module 33 of FIG. 5. As illustrated in FIGS. 6 to 8, the generator module 33 has a thermoelectric conversion element 34 and a set of flow path members 35A and 35B arranged in upper and lower surfaces of the thermoelectric conversion element 34.

The flow path member 35A is a plate-shaped member formed of, for example, metal having a high thermal conduction rate or resin having high corrosion resistance to the seawater. As illustrated in FIG. 5, four openings 35a penetrating in the Y-axis direction are formed in four corners of the flow path member 35A. In addition, U-shaped notches 35h are formed in upper and lower ends of the flow path member 35A.

A trapezoidal recess 35e including a pair of openings 35a of the −X-side is formed on one surface (−Y-side surface) of the flow path member 35A. A trench 35f is formed around the recess 35e along an outer edge of the recess 35e. In addition, trenches 35g are formed around a pair of openings 35a of the +X side along an outer edge of the opening 35a. The other surface (+Y-side surface) of the flow path member 35A is flat. The thermoelectric conversion element 34 is bonded to the flat surface of the flow path member 35A. Note that, although not shown in the drawing, a fin, a protrusion, or the like for agitating the seawater flowing through the recess 35e is arranged in the recess 35e of the flow path member 35A as appropriate. The flow path member 35B has the same configuration as that of the flow path member 35A.

The thermoelectric conversion element 34 is a plate type heat exchange element. The thermoelectric conversion element 34 is shaped to be slightly smaller than the flow path members 35A and 35B. FIG. 9 is a side view illustrating a schematic configuration of the thermoelectric conversion element 34. FIG. 10 is a plan view illustrating a schematic configuration of the thermoelectric conversion element 34.

As recognized from FIGS. 9 and 10, the thermoelectric conversion element 34 has a pair of substrates 340A and 340B, N-type semiconductor devices 341, P-type semiconductor devices 342, and the like.

The substrates 340A and 340B are rectangular substrates formed of, for example, a ceramic material, and their longitudinal directions are set in the Z-axis direction. As illustrated in FIG. 9, the N-type semiconductor devices 341 and the P-type semiconductor devices 342 are interposed between a pair of substrates 340A and 340B. As illustrated in FIG. 10, the N-type semiconductor devices 341 and the P-type semiconductor devices 342 are arranged in a matrix shape placed in the X-axis direction and the Y-axis direction. The N-type semiconductor devices 341 and the P-type semiconductor devices 342 may be formed of, for example, a semiconductor such as a bismuth/tellurium type inorganic material or an organic material such as a conductive polymer.

The N-type semiconductor devices 341 and the P-type semiconductor devices 342 are alternatingly arranged in the X-axis direction and the Y-axis direction such that semiconductors having opposite polarities adjoin each other. In addition, the N-type semiconductor devices 341 and the P-type semiconductor devices 342 arranged side by side along the X-axis direction are alternatingly connected to each other through a conductor 343 provided on surfaces of the substrates 340A and 340B. As a result, a plurality of device lines 345 are formed. The conductor 343 is formed of, for example, copper (Cu).

The conductor 343 of the +X-side end and the conductor 343 of the −X-side end of the device line 345 are connected to, for example, a DC/AC transformer of a power conditioner or the like through a cable (not shown) or the like. In each device line 345, an electrostatic force is generated depending on a difference between a temperature of the substrate 340A side and a temperature of the substrate 340B side. In this state, DC power is output from each device line 345.

As illustrated in FIGS. 6 to 8, the flow path members 35A and 35B and the thermoelectric conversion element 34 configured as described above are integrated by bonding a flat surface of the flow path member 35A and a flat surface of the flow path member 35B to each other by interposing the thermoelectric conversion element 34. As a result, the generator module 33 is formed.

Figure 11:
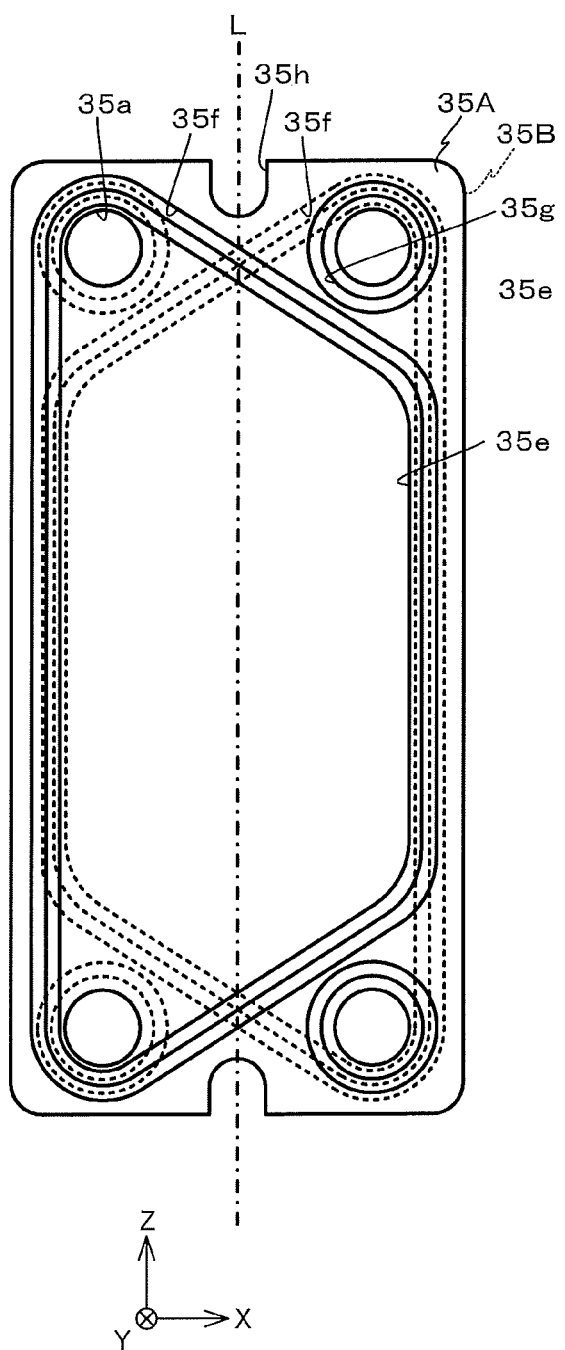
FIG. 11 is a diagram illustrating a flow path member.

In FIG. 11, a flow path member 35A of the generator module 33 is indicated by a solid line, and the flow path member 35B is indicated by a dotted line. As illustrated in FIG. 11, the flow path members 35A and 35B have recesses 35e directed oppositely to each other. Specifically, between the flow path members 35A and 35B, positions of long and short sides of the recesses 35e placed in parallel with the Z axis are opposite to each other with respect to a center line L placed in parallel with the Z axis. In addition, the opening 35a of the flow path member 35A matches the opening 35a of the flow path member 35B, and the notch 35h of the flow path member 35A matches the notch 35h of the flow path member 35B.

Figure 12:
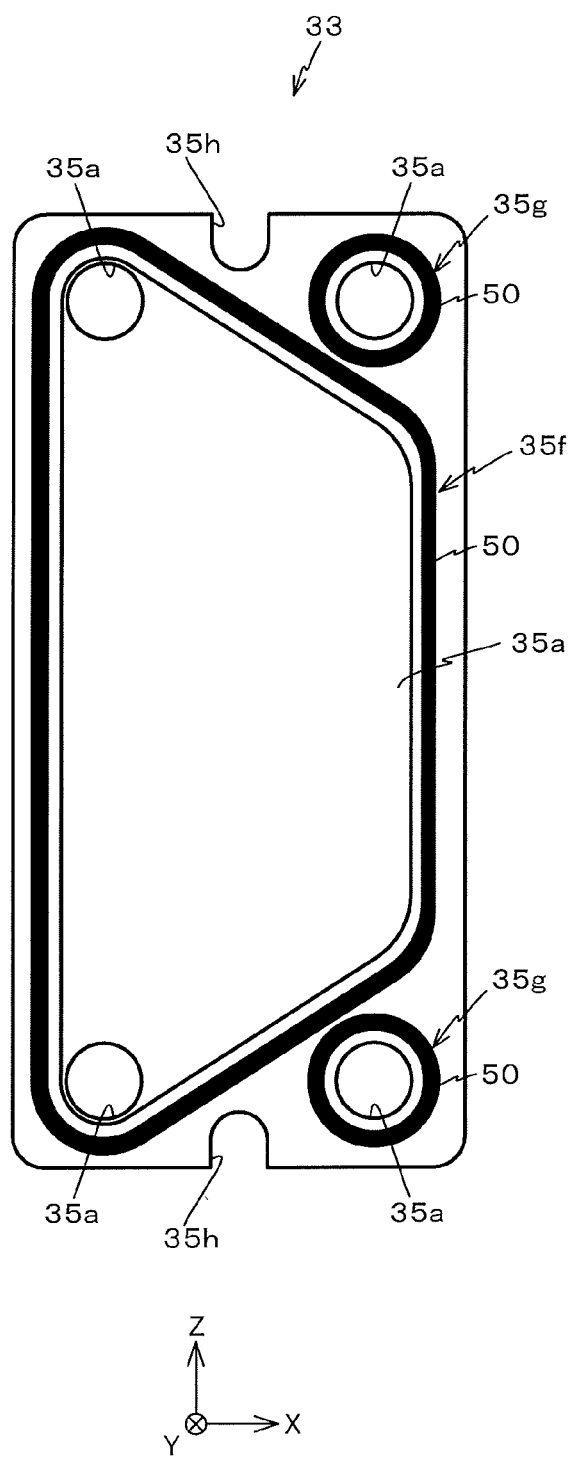
FIG. 12 is a diagram illustrating an O-ring fitted to a trench of the flow path member.

The generator modules 33 are overlappingly assembled as illustrated in FIG. 3 while an O-ring 50 is fitted to the three trenches 35f and 35g as illustrated in FIG. 12. When the generator modules 33 are assembled, the generator modules 33 are arranged such that the recesses 35e overlap with each other between the neighboring generator modules 33.

The generator modules 33 overlappingly arranged are integrally supported by fastening six bolts 40 inserted into the openings 31e and 32e of the support plates 31 and 32 and six nuts 41 while the generator modules are inserted between the support plates 31 and 32 as illustrated in FIG. 3. Each generator module 33 is fixed in position by the bolts 40 arranged inside of the notches 35h of the flow path members 35A and 35B of each generator module 33.

Figure 13:
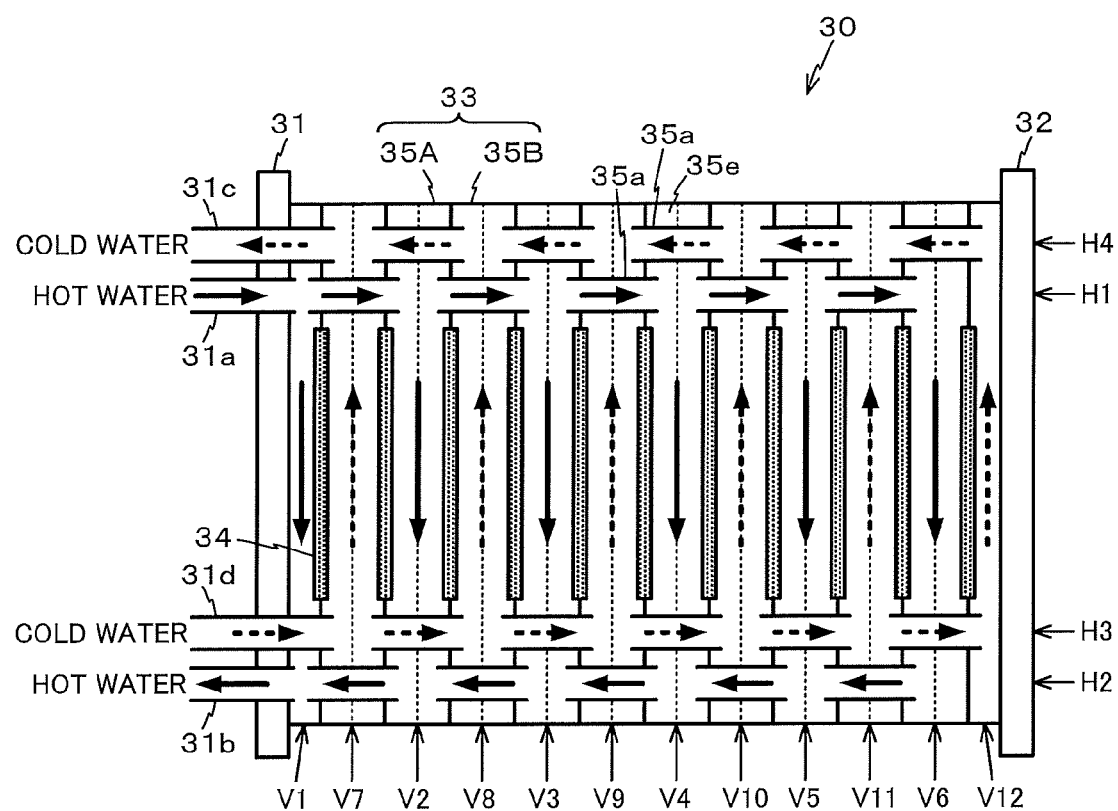
FIG. 13 is a diagram illustrating a flow path formed by integrating the generator modules and the support plates.

FIG. 13 is a diagram illustrating a flow path formed by integrating the generator modules 33 and the support plates 31 and 32. As illustrated in FIG. 13, in the generator unit 30, twelve flow paths V1 to V12 are formed in a vertical direction by the recesses 35e of the flow path members 35A and 35B, and four flow paths H1 to H4 are formed in a horizontal direction by the openings 35a of the flow path members 35A and 35B. The vertical flow paths V1 to V6 are arranged alternatingly with the flow paths V7 to V12.

The flow path H1 communicates with the water intake port 31a, and the flow path H2 communicates with the water drainage port 31b. In addition, the flow path H3 communicates with the water intake port 31d, and the flow path H4 communicates with the water drainage port 31c. Furthermore, out of the flow paths V1 to V12, the flow paths V1 to V6 are connected to the flow paths H1 and H2 in parallel. In addition, the flow paths V7 to V12 are connected to the flow paths H3 and H4 in parallel.

In the generator unit 30 configured as described above, the water intake port 31a is connected to the pipeline P4, and the water intake port 31d is connected to the pipeline P2 as illustrated in FIG. 1. As illustrated in FIG. 2, the generator unit 30 is equipped in a sea embankment 120 placed between the electric generation facility building 130 and the sea.

Next, operations of the thermoelectric generation system 20 will be described. While the electric generator 14 of the electric generation facility 10 is operated, steam generated from the boiler 11 circulates through the high-pressure turbine or the low-pressure turbine 13 and the steam condenser 15. In addition, while the electric generator 14 is operated, the seawater pump 22 is driven to supply seawater to the steam condenser 15 through the pipelines P1 and P3.

When the steam passes through the steam condenser 15, heat is exchanged between the steam and the seawater circulating through the high-temperature cooling unit 15a and the low-temperature cooling unit 15b of the steam condenser 15. The seawater circulating through the low-temperature cooling unit 15b is drained to the sea after the heat exchange. The seawater circulating through the high-temperature cooling unit 15a is heated by performing heat exchange with the steam. The hot water generated by heating the seawater is supplied to the water intake port 31a of the generator unit 30. This hot water circulates through the flow paths H1, H2, and V1 to V6 as indicated by the solid arrow in FIG. 13.

When the seawater pump 22 is operated, the seawater from the sea is supplied to the water intake port 31d of the generator unit 30 through the pipeline P2 branching from the pipeline P1. This seawater is cold water having a temperature lower than that of the seawater circulating through the steam condenser 15. This cold water circulates through the flow paths H3, H4, and V7 to V12 as indicated by the dotted arrow in FIG. 13.

As the hot water circulates through the flow paths H1, H2, and V1 to V6, and the cold water circulates through the flow paths H3, H4, and V7 to V12, a temperature difference is generated between one side and the other side of the thermoelectric conversion elements 34 interposed between the flow paths V1 to V6 and the flow paths V7 and V12. As a result, the thermoelectric conversion element 34 generates electricity.

As described above, the steam condenser 15 of the thermoelectric generation system 20 according to this embodiment has a high-temperature cooling unit 15a for cooling steam having a high temperature and a low-temperature cooling unit 15b for cooling steam having a low temperature as illustrated in FIG. 1. In addition, the seawater heated as it passes through the high-temperature cooling unit 15a of the steam condenser 15 and the seawater pumped by the seawater pump 22 from the sea are supplied to the generator unit 30 as hot water and cold water, respectively. For this reason, compared to a case where electricity is generated using the seawater passing through the low-temperature cooling unit 15b of the steam condenser 15, it is possible to increase a power generation output. Therefore, it is possible to improve power generation efficiency.

In general, if a part of the coolant to be supplied to the steam condenser is used in other applications such as thermoelectric generation, the output power of the high-pressure turbine and the low-pressure turbine decreases. In addition, a power consumption of the seawater pump increases in order to compensate for a pressure loss generated when the seawater heated by the steam condenser passes through the generator unit. For this reason, when the thermoelectric generation is performed, it is necessary to supplement at least a decrease of the turbine output power and a decrease of the power generation output caused by an increase of the power consumption of the seawater pump using the thermoelectric generation.

For example, a difference Ptotal between the power generation output with no thermoelectric generation and the power generation output with thermoelectric generation can be expressed as the following formula (1), where ΔPt(MW) denotes a decrease of the output power of the electric generator caused by a decrease of the turbine output power, ΔPp(MW) denotes an increase of the power consumption of the seawater pump, and ΔPh(MW) denotes a power generation output of the thermoelectric generation unit. Therefore, when thermoelectric generation is performed, the difference Ptotal is necessarily greater than zero. In addition, considering the manufacturing cost or the running cost of the thermoelectric generation unit and the like, the difference Ptotal is desirably equal to or greater than 1 MW.

$$\Delta Ptotal = \Delta Ph - \Delta Pt - \Delta Pp \quad (1)$$

EXAMPLE

Figure 14:
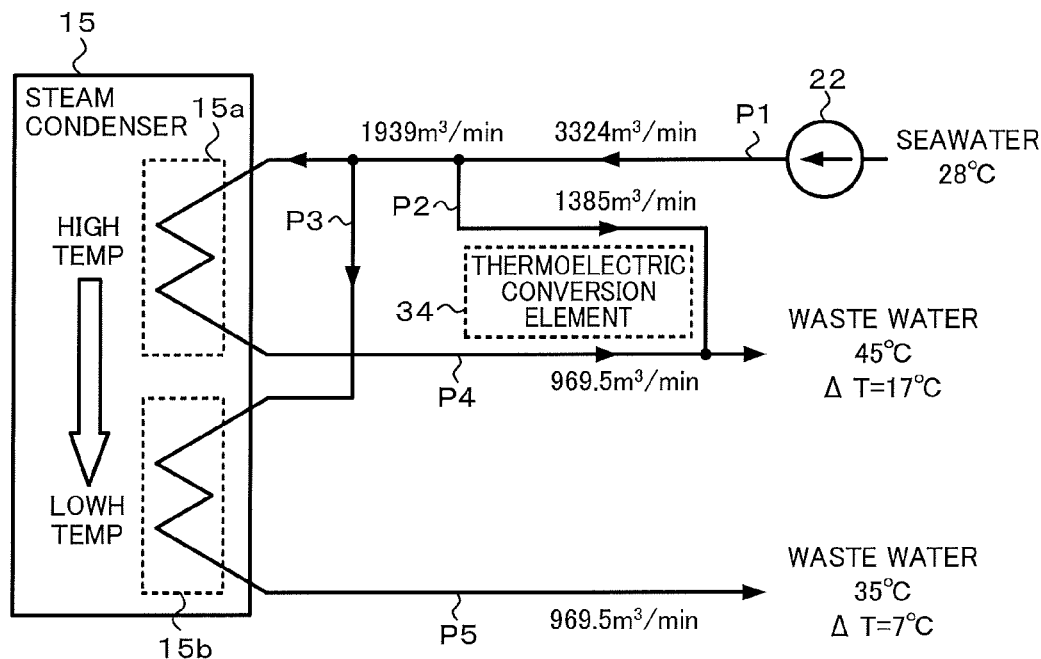
FIG. 14 is a block diagram illustrating a thermoelectric generation system according to an example of the invention.

FIG. 14 illustrates seawater flow rates of each pipeline P1 to P5 of the thermoelectric generation system 20 according to this embodiment. The seawater pump 22 pumps out the seawater, for example, having a temperature of 28° C. at a flow rate of 3,324 m$^3$ per minute. A part of the seawater pumped from the seawater pump 22 is used to cool the thermoelectric conversion element 34 through the pipeline P2. In addition, the remaining seawater is supplied to the steam condenser 15. In this example, the seawater cools the thermoelectric conversion element 34 through the pipeline P2 at a flow rate of 1,385 m$^3$ per minute, and the seawater is supplied to the steam condenser 15 at a flow rate of 1,939 m$^3$ per minute. A half of the seawater supplied to the steam condenser 15 is subjected to heat exchange in the high-temperature cooling unit 15a of the steam condenser 15 and is then discharged through the pipeline P4. The seawater is discharged from the pipeline P4 at a flow rate of 969.5 m$^3$ per minute. This seawater is heated to a temperature of 45° C. to heat the thermoelectric conversion element 34. Since the thermoelectric conversion element 34 is cooled by the seawater having a temperature of 28° C. and at the same time, is heated by the seawater having a temperature of 45° C. as described above, the thermoelectric conversion element 34 generates electric power depending on the temperature difference of the seawater.

Assuming that the thermoelectric conversion element 34 occupies an area of 33,384 m$^2$, and average output power per unit area is set to 340 W/m$^2$, the power generation output ΔPh of the thermoelectric conversion element 34 becomes 11.36 [MW]. Meanwhile, in this case, a decrease ΔPt of the output power of the electric generator caused by a decrease of the turbine output power is 7.0 [MW], and an increase ΔPp of the power consumption of the seawater pump is 1.03 [MW]. For this reason, the difference Ptotal between the power generation output with no thermoelectric generation and the power generation output with thermoelectric generation in the electric generation facility provided with the thermoelectric generation system according to this embodiment becomes +3.34 [MW].

Comparative Example

Figure 15:
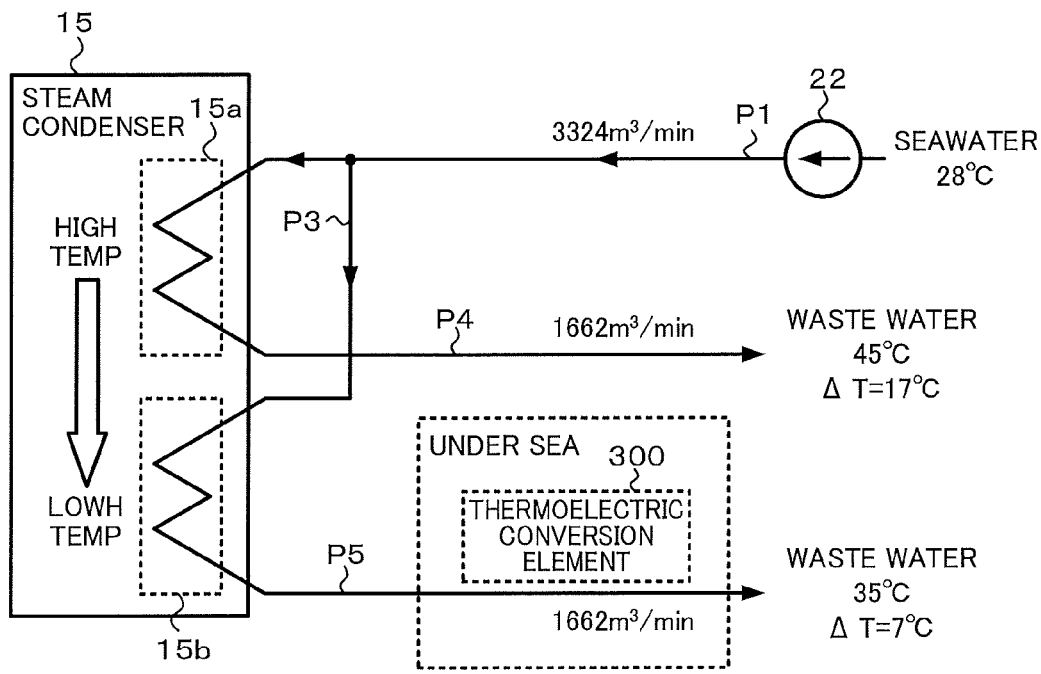
FIG. 15 is a block diagram illustrating a thermoelectric generation system in a comparative example.

FIG. 15 illustrates seawater flow rates of each pipeline P1 to P5 of the thermoelectric generation system in a comparative example. The thermoelectric generation system of a comparative example is different from the thermoelectric generation system 20 according to this embodiment in that electricity is generated on the basis of a temperature difference between the seawater of the sea and the seawater circulating through the low-temperature cooling unit 15b of the steam condenser 15.

In the thermoelectric generation system of the comparative example, the seawater pump 22 pumps out the seawater, for example, having a temperature of 28° C. at a flow rate of 3,324 m$^3$ per minute. The seawater pumped from the seawater pump 22 is supplied to the steam condenser 15. A half of the seawater supplied to the steam condenser 15 is subjected to heat exchange in the high-temperature cooling unit 15a of the steam condenser 15 and is then discharged through the pipeline P4. In addition, the remaining half of the seawater is subjected to heat exchange in the low-temperature cooling unit 15b of the steam condenser 15 and is then discharged through the pipeline P5. The seawater is discharged from the pipeline P4 at a flow rate of 1,662 m$^3$ per minute. This seawater is heated to a temperature of 45° C. Similarly, the seawater is discharged from the pipeline P5 at a flow rate of 1,662 m$^3$ per minute. This seawater is heated to a temperature of 35° C. A part of the pipeline P5 is laid under the sea, and the thermoelectric conversion element 300 is placed around the pipeline P5. This thermoelectric conversion element 300 is heated by the seawater flowing through the pipeline P5 and having a temperature of 35° C. and is cooled by the seawater of the sea having a temperature of 28° C. As a result, the thermoelectric conversion element 300 generates electricity depending on a temperature difference of the seawater.

Since the thermoelectric conversion element 300 is placed around the pipeline P5, it has a small area of 200 m$^2$. Meanwhile, average output power per unit area is 30 W/m$^2$. In the comparative example, the power generation output ΔPh of the thermoelectric conversion element 300 is 0.006 [MW]. Meanwhile, in this case, a decrease ΔPt of the output power of the electric generator caused by a decrease of the turbine output is 0 [MW], and an increase ΔPp of the power consumption of the seawater pump is 0.115 [MW]. For this reason, in the electric generation facility provided with the thermoelectric generation system of the comparative example, the difference Ptotal between the power generation output with no thermoelectric generation and the power generation output with thermoelectric generation becomes −0.109 [MW].

For this reason, in order to efficiently perform thermoelectric generation using the seawater, it is important to use the seawater having a relatively high temperature. However, this is difficult from the viewpoint of reduction of an environmental burden.

Unlike the comparative example, according to this embodiment, the generator unit 30 provided with the thermoelectric conversion element 34 is equipped in the sea embankment 120 as illustrated in FIG. 2. For this reason, unlike the thermoelectric generation system of the comparative example, it is possible to facilitate installation of equipment or maintenance. Therefore, it is possible to reduce the installation cost or the running cost of the generator unit.

As illustrated in FIG. 3, the generator unit 30 has a structure in which a plurality of generator modules 33 are held by the support plates 31 and 32 connected by fastening the bolts 40. For this reason, it is possible to perform maintenance by disassembling the generator modules 33 one by one. In addition, by changing the number of the assembled generator modules 33, it is possible to easily adjust a power generation capacity of the generator unit 30.

The generator unit 30 according to this embodiment is place on land. For this reason, it is possible to drain the hot water passing through the generator unit 30 after cooling it depending on the temperature of the seawater of the sea. It is desirable to maintain a temperature difference between the seawater drained to the sea and the seawater of the sea within a range of 7° C. by mixing the hot water flowing through the pipeline P4 and the cold water flowing through the pipeline P2 as illustrated in FIG. 1.

While the embodiments of the invention have been described hereinbefore, they are not intended to limit the scope of the invention, and various modifications may be possible.

<First Modification>

Figure 16:
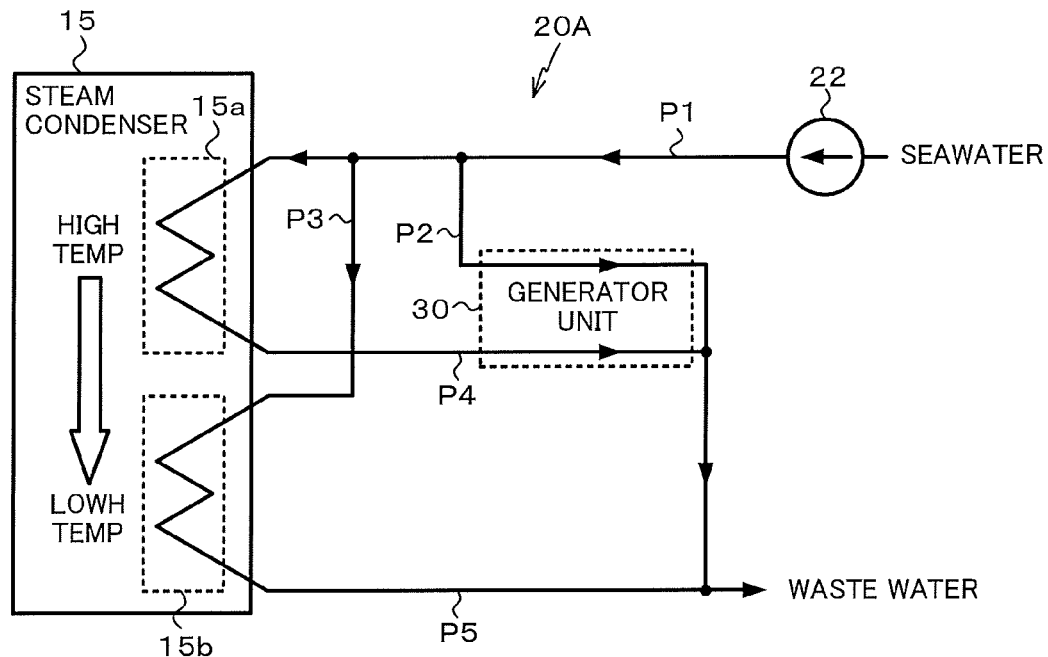
FIG. 16 is a diagram illustrating a thermoelectric generation system according to a modification.

FIG. 16 is a diagram illustrating a thermoelectric generation system 20A according to a first modification. As illustrated in FIG. 16, in the thermoelectric generation system 20A, the pipelines P2 and P4 are connected to the pipeline P5. The temperature of the seawater flowing through the pipeline P5 is lower than the temperature of the seawater flowing through the pipeline P4. For this reason, it is possible to drain the waste water from the generator unit 30 by cooling it. As a result, it is possible to reduce an environmental burden.

<Second Modification>

Figure 17:
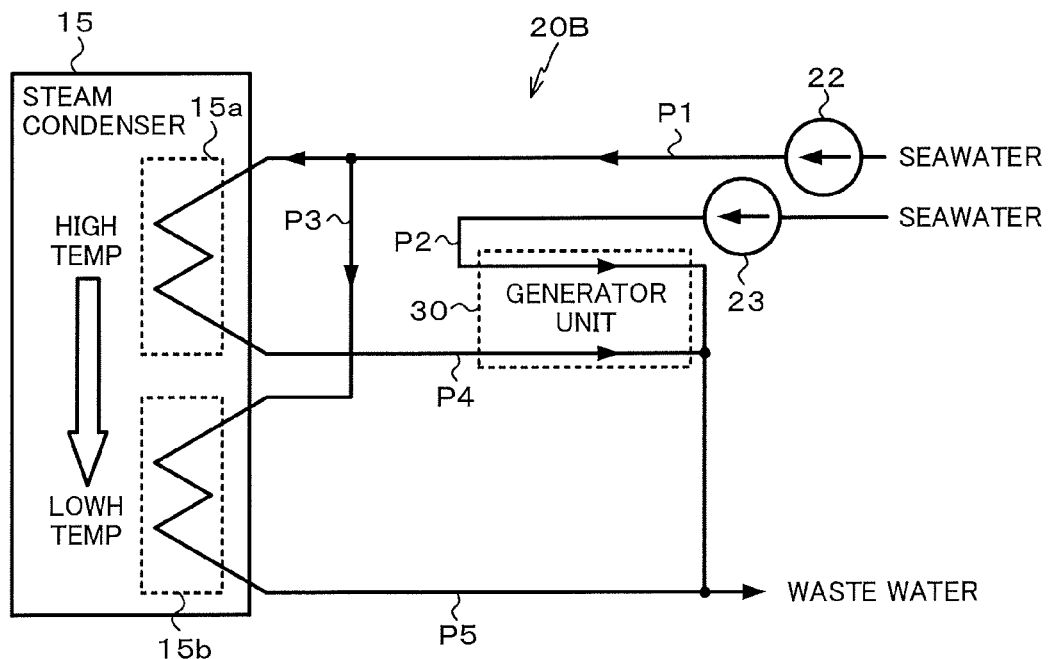
FIG. 17 is a diagram illustrating a thermoelectric generation system according to a modification.

FIG. 17 is a diagram illustrating a thermoelectric generation system 20B according to a second modification. As illustrated in FIG. 17, in the thermoelectric generation system 20B, the pipeline P2 is connected to a seawater pump 23 different from the seawater pump 22. For this reason, the seawater pumped from the seawater pump 22 can be entirely supplied to the steam condenser 15. Therefore, it is possible to generate electricity using the thermoelectric generation system 20 without decreasing the output power of the high-pressure turbine 12 and the low-pressure turbine 13.

<Third Modification>

Figure 18:
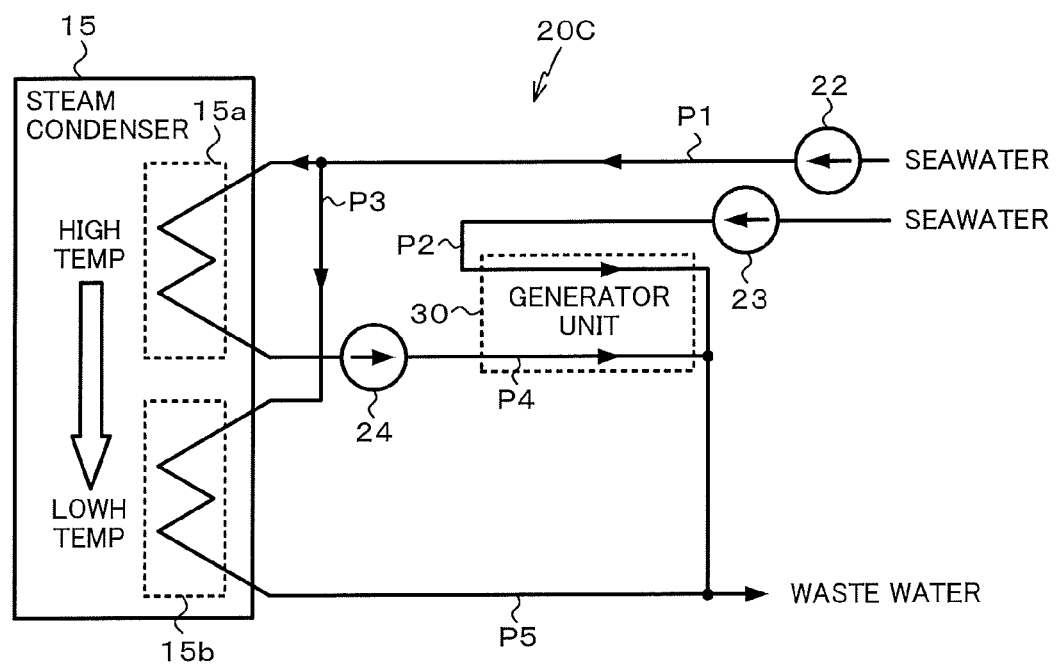
FIG. 18 is a diagram illustrating a thermoelectric generation system according to a modification.

FIG. 18 is a diagram illustrating a thermoelectric generation system 20C according to a third modification. As illustrated in FIG. 18, in the thermoelectric generation system 20C, the pipeline P4 is provided with a seawater pump 24 different from the seawater pumps 22 and 23. As a result, it is possible to reduce the capacity of each seawater pump used in circulation of the seawater. As a result, it is possible to reduce the electric power used in circulation of the seawater.

Figure 19:
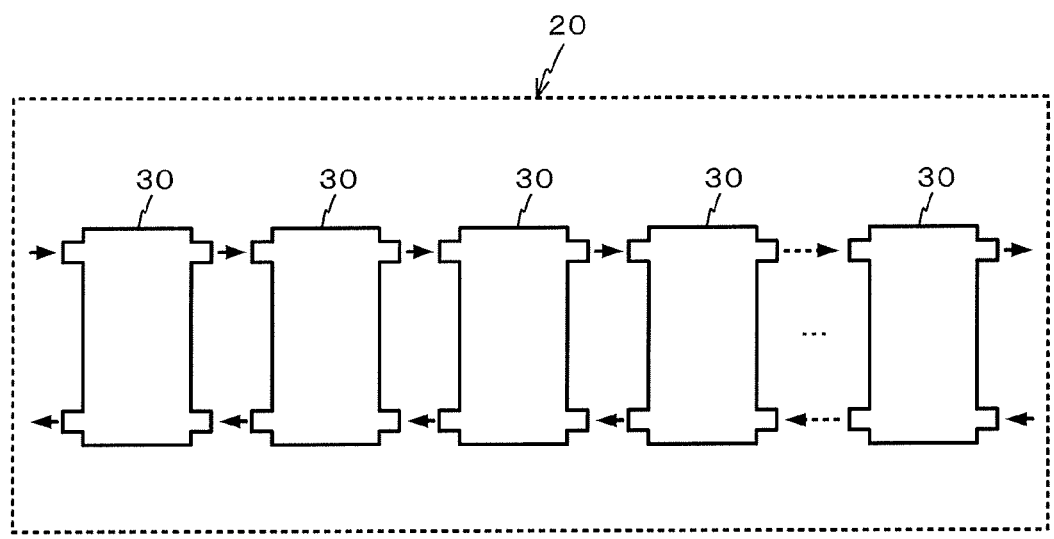
FIG. 19 is a diagram illustrating generator units connected in series.

A case where a single generator unit 30 is provided in the thermoelectric generation system 20 has been described in the aforementioned embodiment. Alternatively, without limiting thereto, the thermoelectric generation system 20 may be provided with a plurality of generator units 30. In addition, as illustrated in FIG. 19, the generator units 30 may be connected in series.

In the aforementioned embodiment, the generator unit 30 of the thermoelectric generation system 20 has eleven generator modules 33.

Alternatively, without limiting thereto, the generator unit 30 may have thirteen or more generator modules 33 or ten or less generator modules 33.

In the aforementioned embodiment, the steam condenser 15 is divided into the high-temperature cooling unit 15a and the low-temperature cooling unit 15b. Alternatively, without limiting thereto, the steam condenser 15 may be divided into a plurality of parts.

In the aforementioned embodiment, the cyclic water circulating through the steam condenser 15 is the seawater. Alternatively, without limiting thereto, water flowing on a river, water pumped from a lake or pond may be used as the cyclic water. In addition, the steam condenser 15 may be supplied with, for example, a liquid cooled by a cooler as the cyclic water. Furthermore, circulation of the cyclic water is interpreted in a broad meaning, including a case where the cyclic water circulates through a closed flow path of the system, or a case where the cyclic water circulates through the steam condenser and an open flow path such as sea or river.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A thermoelectric generation system that generates electricity using waste heat from a facility having an engine driven by steam, a high-temperature cooling unit through which cyclic water passes to cool high-temperature steam from the engine, and a low-temperature cooling unit through which the cyclic water passes to cool low-temperature steam discharged from the high-temperature cooling unit, the thermoelectric generation system comprising:
   a thermoelectric generation unit;
   a first hot-water discharge line used to discharge the cyclic water passing through the high-temperature cooling unit and direct it to the thermoelectric generation unit;
   a second hot-water discharge line used to discharge the cyclic water passing through the low-temperature cooling unit; and
   a cyclic water circulation line through which the cyclic water circulates from an open flow path that is directed into the high-temperature cooling unit, the low-temperature cooling unit, and the thermoelectric generation unit,
   wherein the thermoelectric generation unit generates electricity on the basis of a temperature difference between the cyclic water from the first hot-water discharge line and the cyclic water from the open flow path through the cyclic water circulation line that is directed into the thermoelectric generation unit.

2. The thermoelectric generation system according to claim 1, wherein the high-temperature cooling unit and the low-temperature cooling unit are supplied with the cyclic water from the open flow path through the cyclic water circulation line using a first pump, and the cyclic water circulation line has a first branching pipeline branching from a cyclic water supply pipeline laid between the first pump, the high-temperature cooling unit, the low-temperature cooling unit, and the thermoelectric generation unit to supply the cyclic water to the high-temperature cooling unit, the low-temperature cooling unit, and the thermoelectric generation unit.

3. The thermoelectric generation system according to claim 1, wherein the thermoelectric generation unit has:

a plurality of first water flow paths for flowing the cyclic water from the open flow path through the cyclic water circulation line, and a plurality of second water flow paths each adjoining with one or two of the first water flow paths by interposing a thermoelectric conversion element to flow the cyclic water from the first hot-water discharge line.

4. The thermoelectric generation system according to claim 3, wherein the thermoelectric generation unit is formed by stacking flow path modules including:

the thermoelectric conversion element, a first flow path member arranged in one side of the thermoelectric conversion element and provided with one of the first water flow paths on a surface of the one side, and a second flow path member arranged in the other side of the thermoelectric conversion element and provided with one of the second water flow paths on a surface of the other side.

5. The thermoelectric generation system according to claim 3, wherein the thermoelectric conversion element is an organic thermoelectric conversion element.

6. The thermoelectric generation system according to claim 1, wherein the engine has one or more steam turbines that drive an electric generator, and the thermoelectric generation unit is provided outside of a building where the steam turbines are installed and inside of a sea embankment near the sea from which the cyclic water supplied to the high-temperature cooling unit and the low-temperature cooling unit is taken.

7. The thermoelectric generation system according to claim 1, further comprising a drainage line that drains the cyclic water from the thermoelectric generation unit.

8. The thermoelectric generation system according to claim 3, further comprising a drainage line that drains the cyclic water from the first and second water flow paths to the open flow path.

9. The thermoelectric generation system according to claim 1, wherein the second hot-water discharge line discharges the cyclic water from the low-temperature cooling unit to the open flow path.

* * * * *